United States Patent
Lim

(10) Patent No.: US 7,504,681 B2
(45) Date of Patent: Mar. 17, 2009

(54) IMAGE SENSOR AND METHOD FOR FABRICATING THE SAME

(75) Inventor: Youn-Sub Lim, Chungcheongbuk-do (KR)

(73) Assignee: MagnaChip Semiconductor, Ltd., Chungcheonbuk-do (KR)

(*) Notice: Subject to any disclaimer, the term of this patent is extended or adjusted under 35 U.S.C. 154(b) by 501 days.

(21) Appl. No.: 11/192,848

(22) Filed: Jul. 28, 2005

(65) Prior Publication Data

US 2006/0289910 A1    Dec. 28, 2006

(30) Foreign Application Priority Data

Jul. 29, 2004    (KR) .................. 10-2004-0059491

(51) Int. Cl.
*H01L 31/062* (2006.01)
(52) U.S. Cl. .................. 257/294; 257/291
(58) Field of Classification Search .......... 257/291, 257/294
See application file for complete search history.

(56) References Cited

U.S. PATENT DOCUMENTS 5,737,045 A * 4/1998 Abileah .............. 349/104
2005/0236653 A1 * 10/2005 Lim .................. 257/294

* cited by examiner

*Primary Examiner*—Long Pham
(74) *Attorney, Agent, or Firm*—Blakely, Sokoloff, Taylor & Zafman LLP

(57) ABSTRACT

A complementary metal oxide semiconductor (CMOS) image sensor capable of improving photosensitivity and a signal to noise ratio and a method for fabricating the same are provided. An image sensor for embodying the colors of red, green and blue includes: a plurality of photodiodes formed on a substrate and collecting light incident to different unit pixels; a silicon oxide layer formed on the plurality of photodiodes; a silicon nitride layer formed on the silicon oxide layer, wherein the silicon nitride layer is formed in a single layer in unit pixels of green and blue and split into two layers on an upper portion of the unit pixel of red; and a plurality of microlenses formed on portions of the silicon nitride layer corresponding to the respective photodiodes.

12 Claims, 7 Drawing Sheets

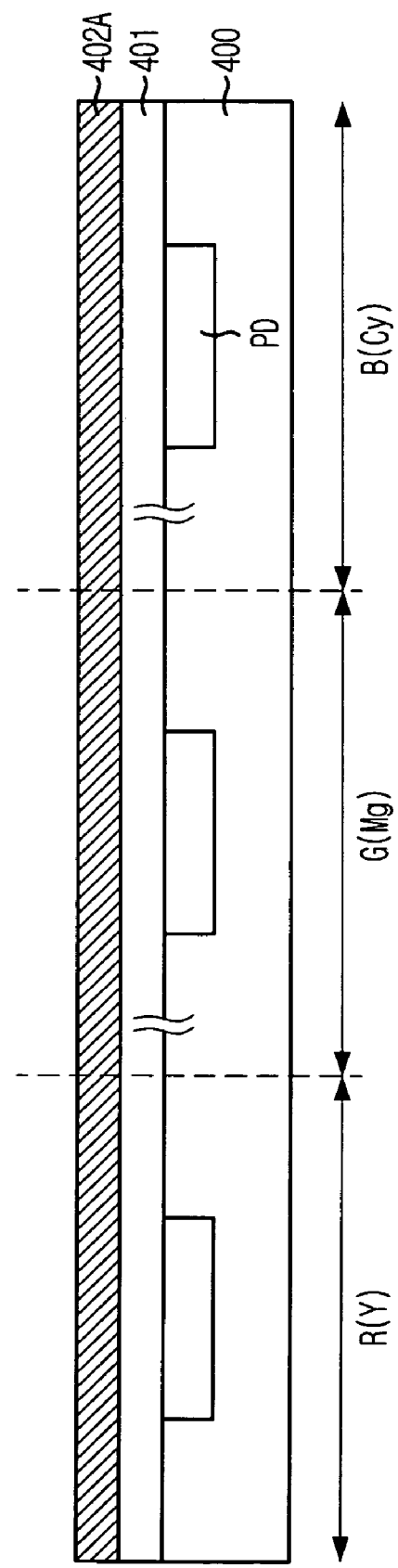

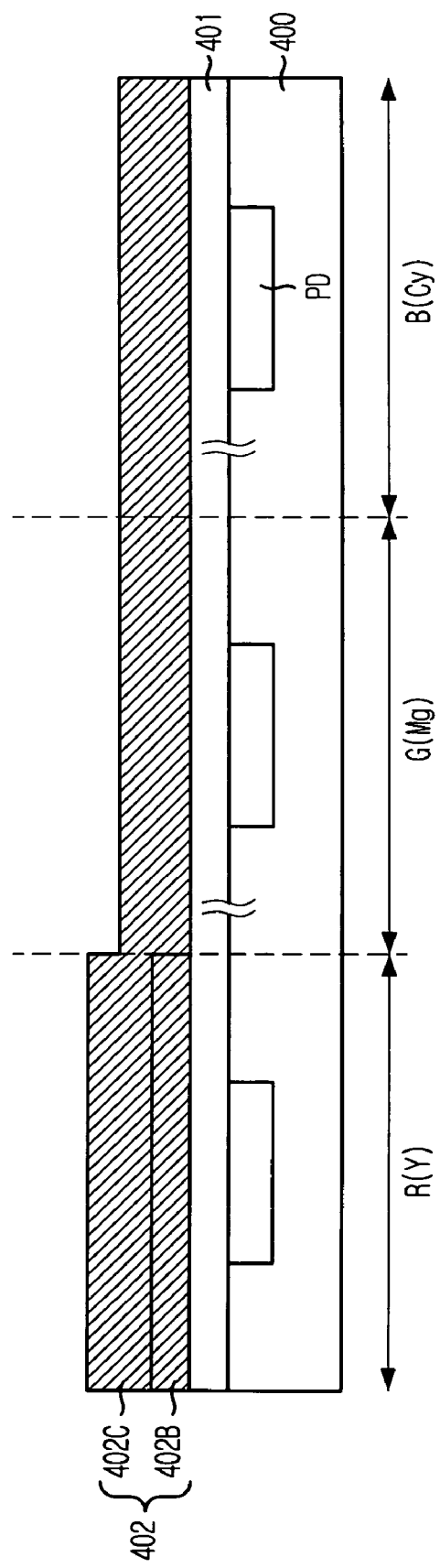

IMAGE SENSOR AND METHOD FOR FABRICATING THE SAME

FIELD OF THE INVENTION

The present invention relates to an image sensor and a fabrication method thereof; and more particularly, to a complementary metal oxide semiconductor (CMOS) image sensor capable of improving photosensitivity and a signal to noise ratio and a method for fabricating the same.

DESCRIPTION OF RELATED ARTS

Image sensors are semiconductor devices converting an optical image into an electrical signal. In the image sensors, a charge coupled device (CCD) is a device that transfers and stores electric charges into metal-oxide semiconductor (MOS) capacitors, which are placed adjacent to each other.

Meanwhile, a complementary metal-oxide-semiconductor (CMOS) image sensor uses CMOS technology using a control circuit and a signal processing circuit as a peripheral circuit and adopts a switching method sequentially detecting outputs using MOS transistors that are formed as many as the number of pixels and using the MOS transistor.

FIG. 1 is a top view illustrating an arrangement of unit pixels of a conventional CMOS image sensor.

Referring to FIG. 1, each individual unit pixel is placed in a lattice structure for capturing colors of red R, green G and blue B which are the three primary colors of the light.

FIG. 2 is a cross-sectional view illustrating unit pixels of a conventional CMOS image sensor taken in the direction of a line A-A' shown in FIG. 1 to show all the colors of red R, green G and blue B.

Referring to FIG. 2, a plurality of field oxide layers FOX are partially formed in a substrate SUB formed by stacking a highly doped $P^{++}$-type region and an epitaxial layer P-EPI. A plurality of gate structures are formed on the substrate SUB and at this time, each of the plurality of gate structures includes a transfer gate Tx. A plurality of photodiodes PD are formed in the substrate SUB. Herein, each of the plurality of photodiodes PD includes an $N^-$-type region in a lower portion of the substrate SUB aligned with one side of the transfer gate Tx due to a deep ion implantation and a P0-type region placed in a region contacted with a surface of the substrate SUB. A plurality of floating diffusion regions FD of a highly doped N-type are formed underneath the surface of the substrate SUB aligned with the other side of the transfer gate Tx.

A pre-metal dielectric layer PMD is formed on an entire surface of the resulting substrate structure including the above described elements and a plurality of first metal lines M1 are formed on the pre-metal dielectric layer PMD. A first inter-metal dielectric layer IMD1 is formed on the first metal lines M1 and a plurality of second metal lines M2 are formed on the first inter-metal dielectric layer IMD1. A second inter-metal dielectric layer IMD2 is formed on the second metal lines M2 and a plurality of third metal lines M3 are formed thereon.

The first to the third metal lines M1 to M3 serve a role in connecting a power line or a signal line to a unit pixel and a logic circuit simultaneously with a role in blocking the light from being entered into regions except for the photodiodes PD.

On the third metal lines M3, a passivation layer PL is formed for a passivation of the lower structure. A first over coating layer OCL1 is formed on the passivation layer PL to secure a process margin during forming color filters and a color filter array CFA is formed on the first over coating layer OCL1 to embody the colors of red R, green G and blue B according to each of the unit pixels.

Although the colors of red R, green G and blue B which are the primary colors are typically used, the complementary colors of yellow (Ye), magenta (Mg) and cyan (Cy) can be also used for the unit pixels.

A second over coating layer OCL2 is formed to secure a process margin during forming microlenses on the color filter array CFA and a plurality of microlenses ML are formed on the second over coating layer OCL2.

Herein, the plurality of microlenses ML focus the incident light, which in turn, enters into the photodiodes PD.

As a pixel size is decreased, a photodiode size, i.e., a region for collecting the light, is also decreased in proportionate to the decreased pixel size. The decrease in the photodiode size gives a critical influence on a photosensitivity property of the image sensor.

Although degradation in the photosensitivity can be overcome by technologies of a microlens and a color filter, it is still difficult to secure a property to an acceptable level.

Due to a relatively big difference in each photosensitivity level of the colors of red, green and blue caused by a limitation in a photodiode structure, RGB gains should be relatively increased. Accordingly, there may be disadvantages that uniformity of the individual pixels decreases and a noise level increases. These disadvantages may further induce degradation of a signal to noise ratio (SNR).

SUMMARY OF THE INVENTION

It is, therefore, an object of the present invention to provide an image sensor capable of reducing a difference in photosensitivity of individual colors of red, green and blue or individual colors of yellow, magenta and cyan, and of increasing uniformity between unit pixels and a method for fabricating the same.

In accordance with one aspect of the present invention, there is provided an image sensor for embodying the colors of red, green and blue, including: a plurality of photodiodes formed on a substrate and collecting light incident to different unit pixels; a silicon oxide layer formed on the plurality of photodiodes; a silicon nitride layer formed on the silicon oxide layer, wherein the silicon nitride layer is formed in a single layer in unit pixels of green and blue and split into two layers on an upper portion of the unit pixels of red; and a plurality of microlenses formed on portions of the silicon nitride layer corresponding to the respective photodiodes.

In accordance with another aspect of the present invention, there is provided an image sensor for embodying the colors of yellow, magenta and cyan, including: a plurality of photodiodes formed on a substrate and collecting light incident to different unit pixels; a silicon oxide layer formed on the plurality of photodiodes; a silicon nitride layer formed on the silicon oxide layer, wherein the silicon nitride layer is formed in a single layer in unit pixels of magenta and cyan and split into two layers on an upper portion of the unit pixels of yellow; and a plurality of microlenses formed on portions of the silicon nitride layer corresponding to the respective photodiodes.

In accordance with further aspect of the present invention, there is provided a method for fabricating an image sensor for embodying the colors of red, green and blue, including the steps of: forming a plurality of photodiodes collecting light incident to different unit pixels on a substrate; forming a silicon oxide layer on the plurality of photodiodes; forming a first silicon nitride layer on the silicon oxide layer; selectively removing the first silicon nitride layer in unit pixels of green and blue; forming a second silicon nitride layer on the silicon oxide layer and a remaining portion of the first silicon nitride layer; and forming a plurality of microlenses on portions of the silicon nitride layer corresponding to the respective photodiodes.

In accordance with still further aspect of the present invention, there is provided a method for fabricating an image sensor for embodying the colors of yellow, magenta and cyan, including the steps of: forming a plurality of photodiodes collecting light incident to different unit pixels on a substrate; forming a silicon oxide layer on the plurality of photodiodes; forming a first silicon nitride layer on the silicon oxide layer; selectively removing the first silicon nitride layer in unit pixels of magenta and cyan; forming a second silicon nitride layer on the silicon oxide layer and a remaining portion of the first silicon nitride layer; and forming a plurality of microlenses on portions of the silicon nitride layer corresponding to the respective photodiodes.

BRIEF DESCRIPTION OF THE DRAWINGS

The above and other objects and features of the present invention will become better understood with respect to the following description of the preferred embodiments given in conjunction with the accompanying drawings, in which:

FIGS. 4A to 4C are cross-sectional views illustrating a method for fabricating an image sensor with the specific embodiment in accordance with the present invention.

DETAILED DESCRIPTION OF THE INVENTION

Hereinafter, detailed descriptions of certain embodiments of the present invention will be provided with reference to the accompanying drawings.

Figure 1:
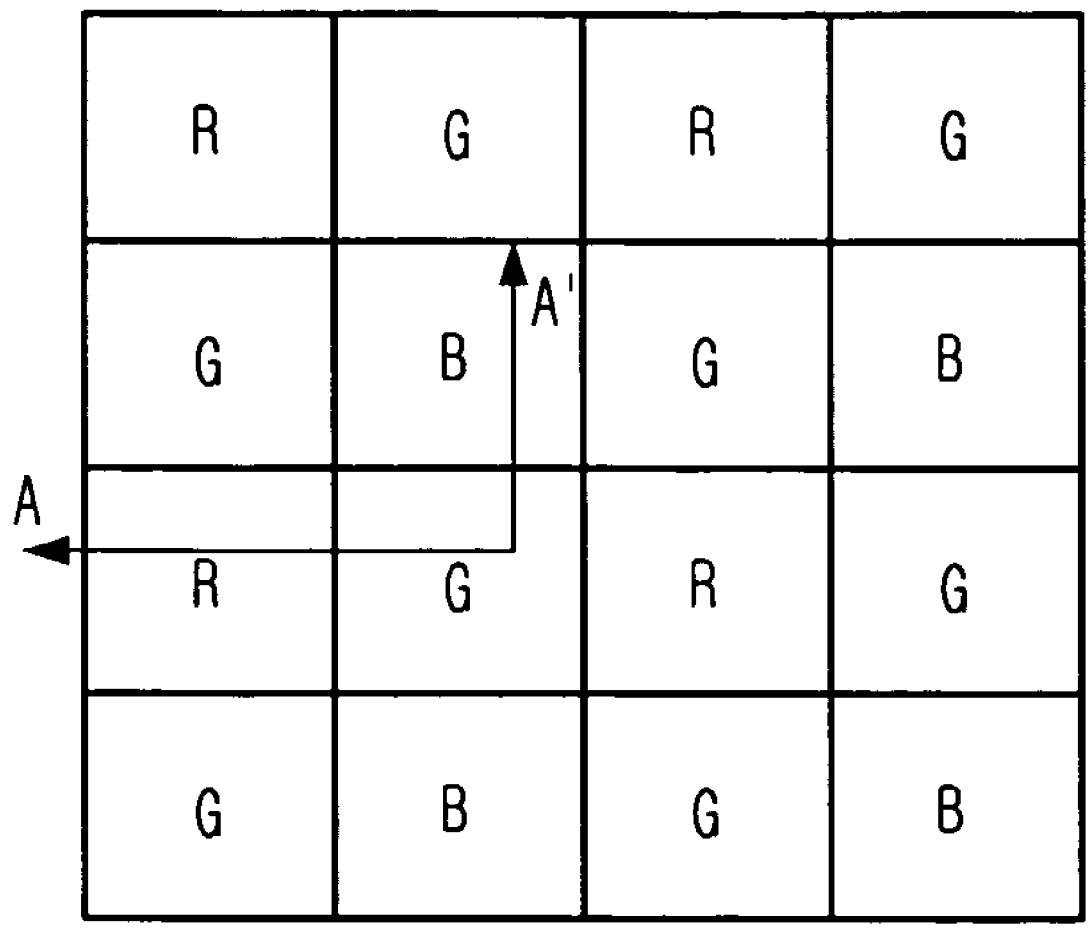
FIG. 1 is a top view illustrating an arrangement of unit pixels of a conventional complementary metal oxide semiconductor (CMOS) image sensor.
Figure 2:
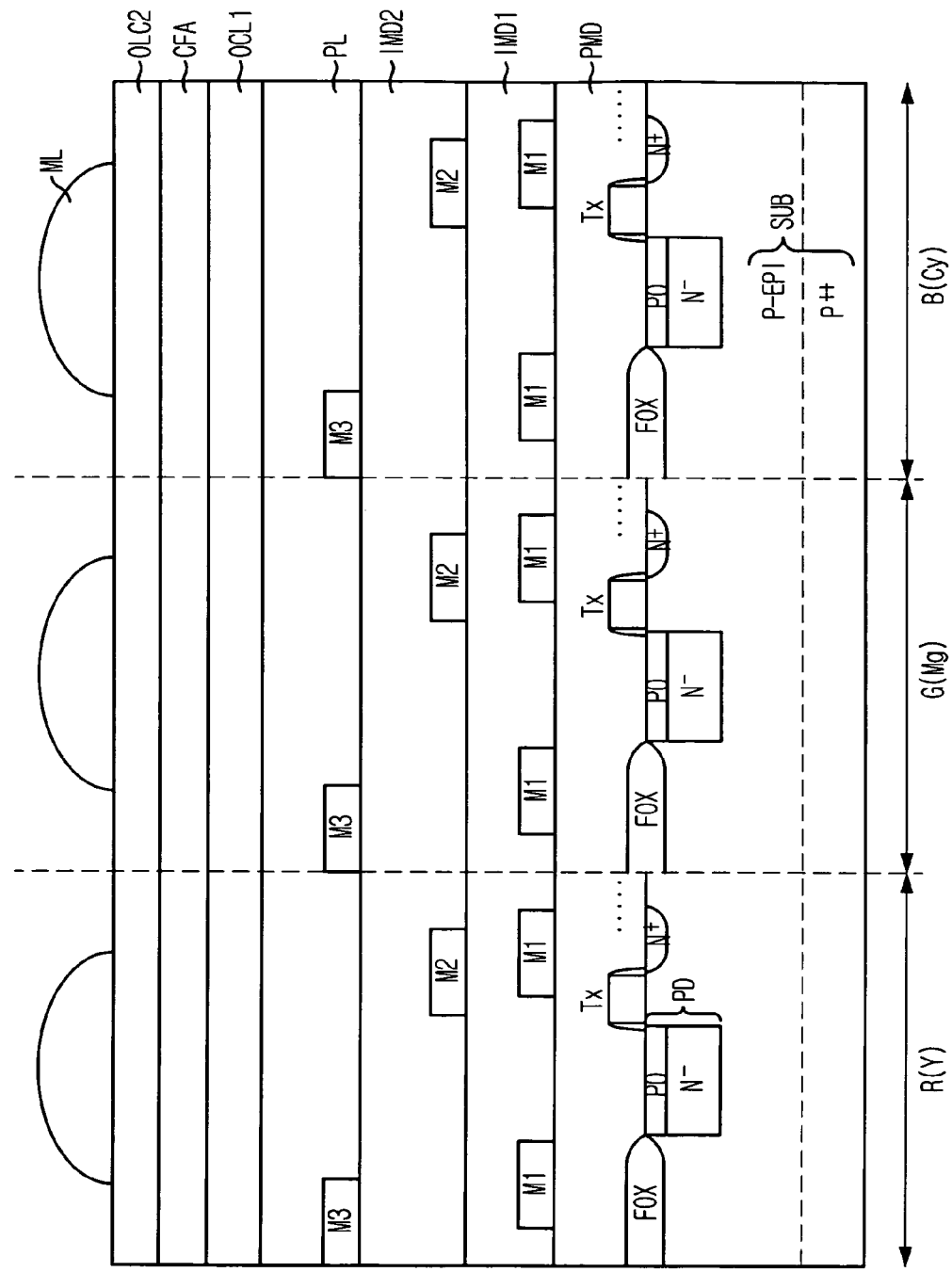
FIG. 2 is a cross-sectional view illustrating unit pixels of a conventional CMOS image sensor taken in the direction of a line A-A' shown in FIG. 1.
Figure 3:
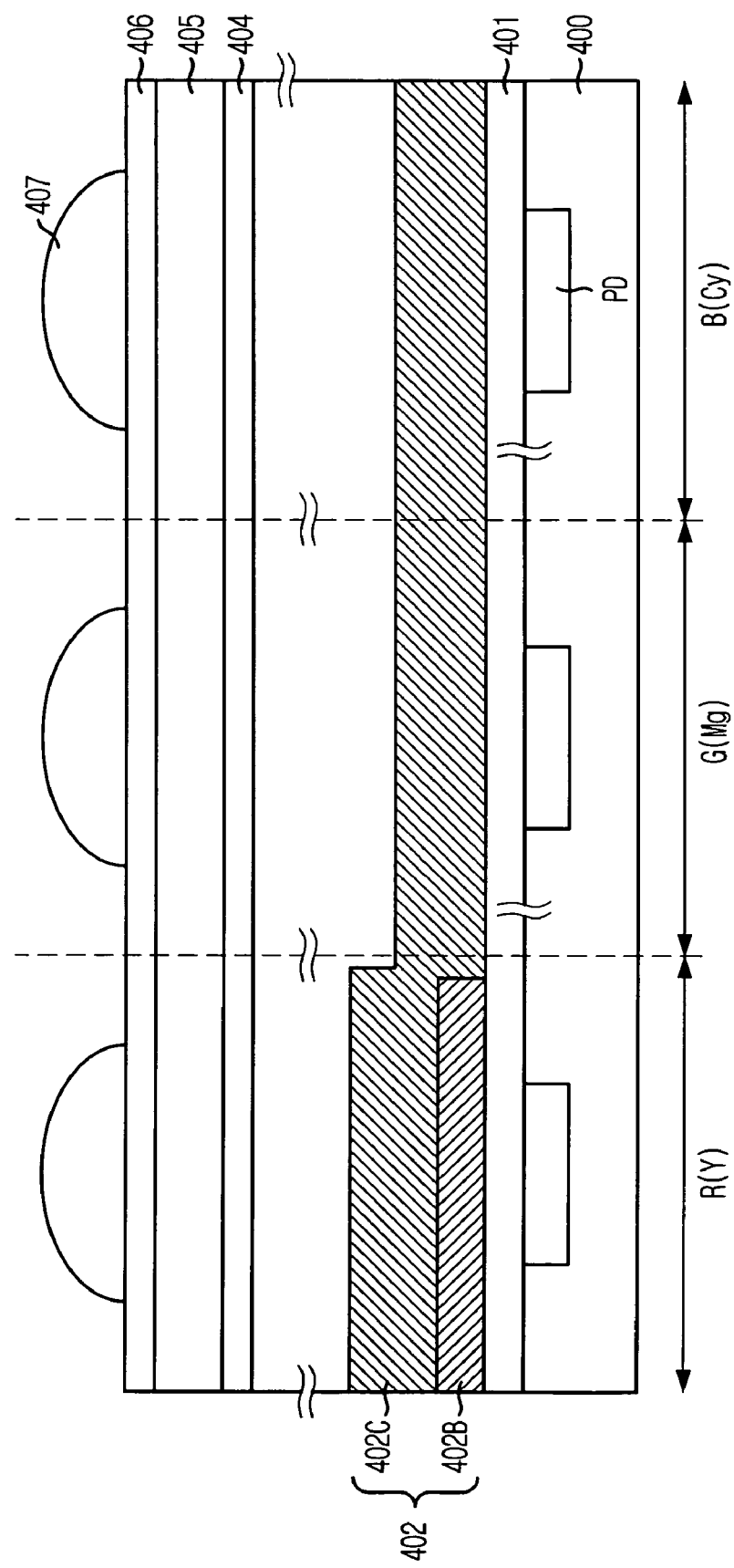
FIG. 3 is a cross-sectional view briefly illustrating a CMOS image sensor in accordance with a specific embodiment of the present invention.

FIG. 3 is a cross-sectional view briefly illustrating a complementary metal oxide semiconductor (CMOS) image sensor in accordance with a specific embodiment of the present invention.

Referring to FIG. 3, the image sensor includes: a plurality of photodiodes PD operating as light collecting devices of different individual unit pixels formed on a substrate 400; a silicon oxide layer 401 formed over the plurality of photodiodes PD; a silicon nitride layer 402 including a first silicon nitride layer 402B and a second silicon nitride layer 402C, wherein the second nitride layer 402C is formed in unit pixels of green G and blue B and the first nitride layer 402B and the second nitride layer 402C are formed in a unit pixel of red R with different thickness; and a plurality of microlenses 407 formed on the silicon nitride layer 402 corresponding to the respective photodiodes PD. A first over coating layer (OCL1) 404, a color filter array 405 and a second over coating layer (OCL2) 406 are sequentially formed on the silicon nitride layer 402.

Meanwhile, in addition to the colors of red R, green G and blue B, the aforementioned image sensor can be applied to a unit pixel structure using the complementary colors of yellow Ye, magenta Mg and cyan Cy. Hereinafter, it is assumed that the unit pixels of red R, green G and blue B corresponds to the unit pixels of yellow Ye, magenta Mg and cyan Cy, respectively.

As described above, the silicon nitride layer 402 is formed in a stack structure by stacking the first silicon nitride layer 402B and the second silicon nitride layer 402C on an upper portion of the unit pixel of red R and has a thickness ranging from approximately 400 Å to approximately 600 Å. The silicon nitride layer 402 is a single structure of the second silicon nitride layer 402C on upper portions of the unit pixels of green G and blue B, and has a thickness of ranging from approximately 300 Å to approximately 400 Å.

The silicon oxide layer 401 has a thickness ranging from approximately 150 Å to approximately 250 Å. An exemplary material used for the silicon oxide layer 401 is a high temperature low-k dielectric layer (HLD).

On the silicon nitride layer 402, the first over coating layer (OCL1) 404, the color filter array 405 and the second over coating layer (OCL2) 406 are sequentially formed.

Herein, the substrate 400 is formed by stacking a P-type epitaxial layer and a highly doped $P^{++}$-region. A plurality of metal lines, i.e., first metal lines (M1), second metal lines (M2) and third metal lines (M3), and a plurality of dielectric layers, i.e., a pre-metal dielectric (PMD) layer, a first inter-metal dielectric (IMD1) layer and a second inter-metal dielectric (IMD2) layer, are formed between the photodiodes PD and the silicon oxide layer 401 or between the silicon nitride layer 402 and the OCL1 404.

Figure 4B:
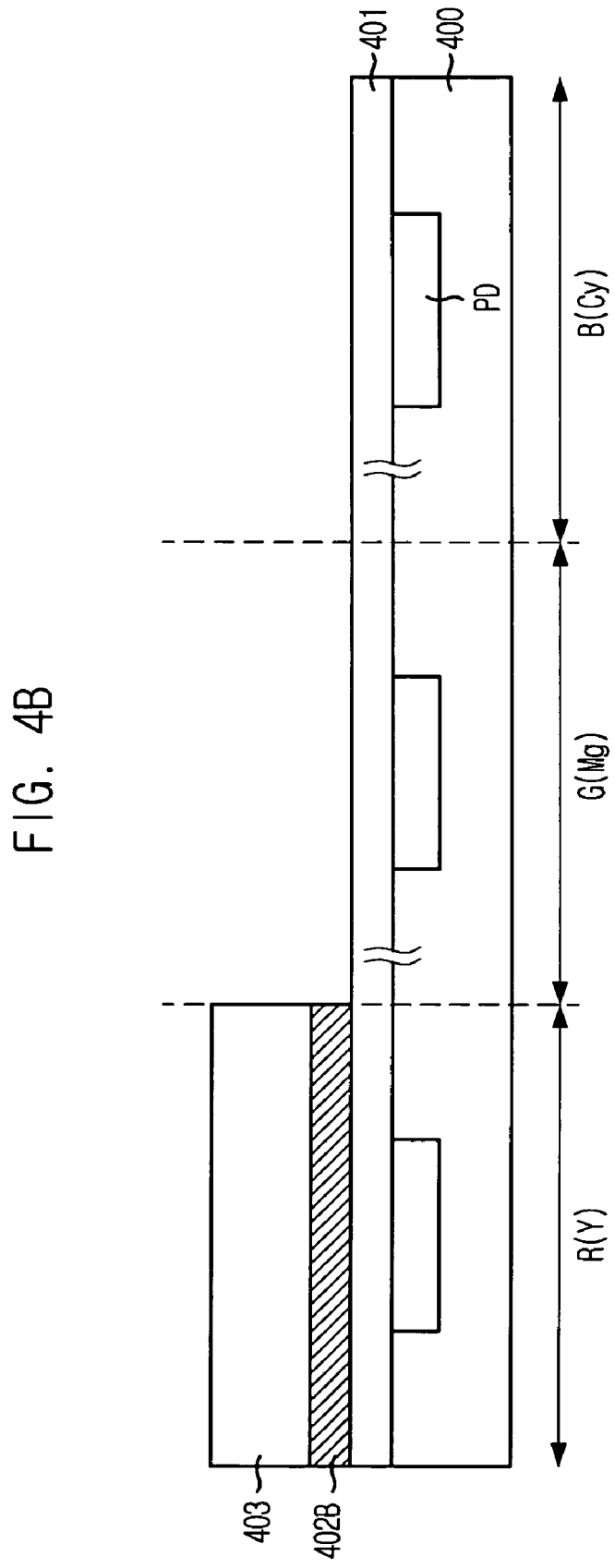

FIGS. 4A to 4C are cross-sectional views illustrating a method for fabricating an image sensor in accordance with the specific embodiment of the present invention.

First, referring to FIG. 4A, field oxide layers and wells are formed on a substrate 400 although not shown.

Subsequently, a plurality of transfer gates (not shown) are formed on the substrate 400. A plurality of photodiodes PD are formed underneath a surface portion of the substrate 400. At this time, each of the photodiodes PD includes a deep $N^-$-type region and a thin P0-type region aligned with one side of the individual transfer gate. Afterwards, although not shown, a plurality of floating diffusion regions are formed underneath another surface portion of the substrate 400. Herein, each of the plurality of floating diffusion regions is aligned with the other side of the individual transfer gate.

Subsequently, a silicon oxide layer 401 is formed on the above resulting structure in a thickness ranging from approximately 150 Å to approximately 250 Å and then, a first silicon nitride layer 402A is formed in a thickness ranging from approximately 100 Å to approximately 200 Å.

Next, as shown in FIG. 4B, a mask pattern 403 masking a unit pixel of red R is formed on the first silicon nitride layer 402A. Afterwards, the first silicon nitride layer 402A is removed by using the mask pattern 403 as an etch mask and thus, the first silicon nitride layer 402A remains in the unit pixel of red R. A remaining portion of the first silicon nitride layer is denoted with a reference numeral 402B.

Next, the mask pattern 403 is removed.

As shown in FIG. 4C, a second silicon nitride layer 402C is formed in a thickness ranging from approximately 300 Å to approximately 400 Å on an entire surface where the remaining first silicon nitride layer 402B selectively remains. At this time, a planarization process can be separately performed on the unit pixel of red R and other unit pixels to planarize the second silicon nitride layer 402C.

After the planarization process, in the unit pixel of red R, the remaining first silicon layer 402B and the second silicon layer 402C has a thickness ranging from approximately 400 Å to approximately 600 Å. In the unit pixels of green G and blue B, only the second silicon nitride layer 402C exists in a thickness ranging from approximately 300 Å to approximately 400 Å.

Subsequently, pre-metal dielectric (PMD) layers, first metal lines (M1), first inter-metal dielectric (IMD1) layers, second metal lines (M2), second inter-metal dielectric (IMD2) layers, third metal lines (M3), a passivation layer, a first over coating layer (OCL1), a color filters, a second over coating layer (OCL2), and microlenses are formed and thus, the image sensor shown in FIG. 3 is completed.

Figure 5:
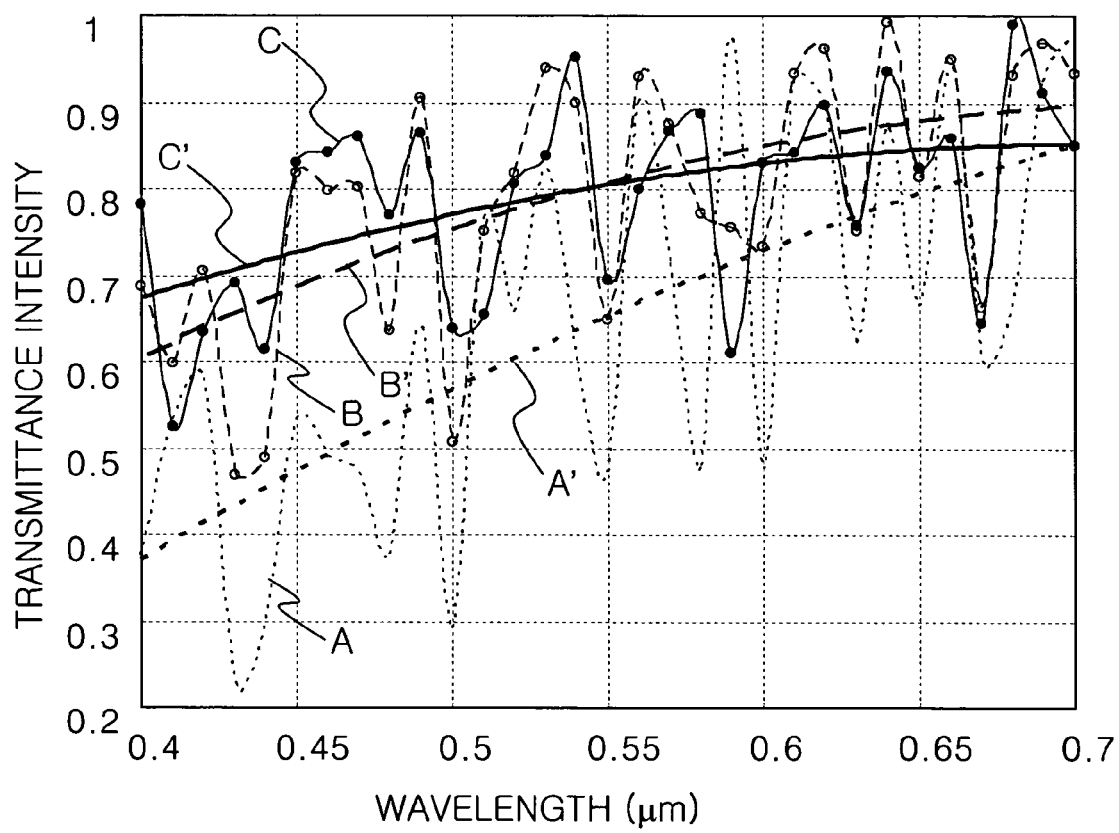
FIG. 5 is a graph illustrating a difference in transmittance intensity between a conventional image sensor and an embodied image sensor according to a different range of wavelengths.

FIG. 5 is a graph illustrating a difference in transmittance intensity between a conventional image sensor and an embodied image sensor according to a different range of wavelengths.

A horizontal axis and a vertical axis of the graph shown in FIG. 5 indicate a wavelength of the light and transmittance intensity, respectively in case that the light is transmitted to a silicon oxide layer and/or a silicon nitride layer.

Herein, a reference denotation A illustrates a transmittance property according to each different wavelength range in the case that the light is transmitted only to the silicon oxide layer generally used for forming the PMD layer and the IMD layer in the conventional image sensor. A reference denotation A' illustrates an average transmittance intensity of the aforementioned case. As shown through the reference denotations A and A', in the case that the light is transmitted to the conventional silicon oxide layer, it is noticed that the transmittance intensity is markedly low at both the blue color having a reference wavelength of 0.45 μm and the red color having a reference wavelength of 0.55 μm.

Herein, following the example of the present invention, the silicon oxide layer with a thickness of approximately 200 Å is used; the silicon nitride layer with a thickness of 350 Å is used in the unit pixels of green and blue; and the silicon nitride layer with a thickness of approximately 500 Å is used in the red unit pixel.

A reference denotation B illustrates a transmittance property, i.e., a response property, at the red color using a reference wavelength of approximately 0.55 μm and a reference denotation B' illustrates an average transmittance intensity of the aforementioned case. Herein, the reference denotations B and B' indicate the transmittance property in the case that the light is transmitted to the silicon oxide layer with a thickness of approximately 200 Å and the silicon nitride layer with a thickness of approximately 500 Å in accordance with the present invention.

A reference denotation C illustrates transmittance intensity at the blue and green colors using a reference wavelength of approximately 0.45 μm and, a reference denotation C' illustrates an average transmittance property of the aforementioned case. Herein, the reference denotations C and C' indicate the transmittance property in the case that the light is transmitted to the silicon oxide layer with a thickness of approximately 200 Å and the silicon nitride layer with a thickness of approximately 350 Å in accordance with the present invention.

The reference denotations B, B', C and C' illustrate that the transmittance intensity is markedly increased in the whole wavelength range in accordance with the present invention compared with the conventional wavelength shown through the reference denotations A and A'.

Furthermore, the above result shown in FIG. 5 can be identically applied to the image sensor using the colors of yellow, magenta and cyan in addition to the image sensor using the color of red, green and blue.

In accordance with the present invention, it is possible to produce a color spectrum property capable of improving a fundamental property related to degradation in photosensitivity according to a decreased unit pixel size and further, of reducing RGB gains. That is, it is possible to minimize a deviation in a photosensitivity level of the color of red, green and blue without degrading a color reproduction property, thereby improving a signal to noise ratio (SNR) property of the image sensor.

The present application contains subject matter related to the Korean patent application No. KR 2004-0059491, filed in the Korean Patent Office on Jul. 29, 2004, the entire contents of which being incorporated herein by reference.

While the present invention has been described with respect to certain preferred embodiments, it will be apparent to those skilled in the art that various changes and modifications may be made without departing from the spirit and scope of the invention as defined in the following claims.

What is claimed is:

1. An image sensor for embodying the colors of red, green and blue, comprising:
   a plurality of photodiodes collecting light incident to different unit pixels;
   a silicon oxide layer formed over the plurality of photodiodes;
   a silicon nitride layer formed on the silicon oxide layer, wherein the silicon nitride layer has a greater thickness over the unit pixel of red than over the unit pixel of blue; and
   a plurality of microlenses formed over portions of the silicon nitride layer corresponding to the respective photodiodes.

2. The image sensor of claim 1, wherein the silicon nitride layer has a thickness ranging from approximately 400 Å to approximately 600 Å over the unit pixel of red and has a thickness ranging from approximately 300 Å to approximately 400 Å over the unit pixel of blue.

3. The image sensor of claim 2, wherein the silicon nitride layer has a thickness ranging from approximately 300 Å to approximately 400 Å over the unit pixel of green.

4. The image sensor of claim 2, wherein the silicon oxide layer has a thickness ranging from approximately 150 Å to approximately 250 Å.

5. The image sensor of claim 3, wherein the silicon oxide layer has a thickness ranging from approximately 150 Å to approximately 250 Å.

6. An image sensor for embodying the colors of yellow, magenta and cyan, comprising:
   a plurality of photodiodes collecting light incident to different unit pixels;
   a silicon oxide layer formed over the plurality of photodiodes;
   a silicon nitride layer formed on the silicon oxide layer, wherein the silicon nitride layer has a greater thickness over the unit pixel of yellow than over the unit pixel of cyan; and
   a plurality of microlenses formed over portions of the silicon nitride layer corresponding to the respective photodiodes.

7. The image sensor of claim 6, wherein the silicon nitride layer has a thickness ranging from approximately 400 Å to approximately 600 Å over the unit pixel of yellow and has a thickness ranging from approximately 300 Å to approximately 400 Å over the unit pixel of cyan.

8. The image sensor of claim 7, wherein the silicon nitride layer has a thickness ranging from approximately 300 Å to approximately 400 Å over the unit pixel of magenta.

9. The image sensor of claim 7, wherein the silicon oxide layer has a thickness ranging from approximately 150 Å to approximately 250 Å.

10. The image sensor of claim 8, wherein the silicon oxide layer has a thickness ranging from approximately 150 Å to approximately 250 Å.

11. The image sensor of claim 1, wherein the silicon nitride layer over the unit pixel of red includes a stack structure of layers.

12. The image sensor of claim 1, wherein the silicon oxide layer includes a high temperature low-k dielectric layer.

* * * * *